(12) United States Patent
Hsu et al.

(10) Patent No.: US 12,451,455 B2
(45) Date of Patent: Oct. 21, 2025

(54) SYSTEMS AND METHODS FOR DIRECT BONDING IN SEMICONDUCTOR DIE MANUFACTURING

(71) Applicant: Micron Technology, Inc., Boise, ID (US)

(72) Inventors: Bang-Ning Hsu, Taichung (TW); Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 457 days.

(21) Appl. No.: 17/857,967

(22) Filed: Jul. 5, 2022

(65) Prior Publication Data

US 2023/0066395 A1    Mar. 2, 2023

Related U.S. Application Data

(60) Provisional application No. 63/238,084, filed on Aug. 27, 2021.

(51) Int. Cl.
*H01L 23/00* (2006.01)

(52) U.S. Cl.
CPC ............. *H01L 24/32* (2013.01); *H01L 24/29* (2013.01); *H01L 24/80* (2013.01); *H01L 24/83* (2013.01); *H01L 24/05* (2013.01); *H01L 2224/05647* (2013.01); *H01L 2224/05655* (2013.01); *H01L 2224/0579* (2013.01); *H01L 2224/05799* (2013.01); *H01L 2224/29186* (2013.01);

(Continued)

(58) Field of Classification Search
CPC .......... H01L 24/32; H01L 24/29; H01L 24/83
See application file for complete search history.

(56) References Cited

U.S. PATENT DOCUMENTS

| 2017/0294394 A1* | 10/2017 | Suzuki | .................... B32B 15/04 |
| 2020/0006285 A1 | 1/2020 | Wang et al. | |
| 2021/0098411 A1 | 4/2021 | Liff et al. | |

FOREIGN PATENT DOCUMENTS

| CN | 112563235 A | 3/2021 |
| KR | 20210036794 A | 4/2021 |

OTHER PUBLICATIONS

KR Patent Application No. 10-2022-0104713—Korean Office Action and Search Report, dated Aug. 28, 2024, with English Translation, 13 pages.

* cited by examiner

*Primary Examiner* — Dale E Page
*Assistant Examiner* — Wilner Jean Baptiste
(74) *Attorney, Agent, or Firm* — Dorsey & Whitney LLP

(57) ABSTRACT

A method for bonding semiconductor dies, resulting semiconductor devices, and associated systems and methods are disclosed. In some embodiments, the method includes depositing a first material on the first semiconductor die. The first material has a first outer surface and a first chemical composition at the first outer surface. The method also includes depositing a second material on the second semiconductor die. The second material has a second outer surface and a second chemical composition at the second outer surface that is different from the first chemical composition. The method also includes stacking the dies. The second outer surface of the second semiconductor die is in contact with the first outer surface of the first semiconductor die in the stack. The method also includes reacting the first outer surface with the second outer surface. The reaction causes the first outer surface to bond to the second outer surface.

16 Claims, 8 Drawing Sheets

(52) U.S. Cl.
CPC ............. *H01L 2224/2919* (2013.01); *H01L 2224/2929* (2013.01); *H01L 2224/29299* (2013.01); *H01L 2224/32145* (2013.01); *H01L 2224/32501* (2013.01); *H01L 2224/80895* (2013.01); *H01L 2224/83232* (2013.01); *H01L 2224/83896* (2013.01)

SYSTEMS AND METHODS FOR DIRECT BONDING IN SEMICONDUCTOR DIE MANUFACTURING

CROSS-REFERENCE TO RELATED APPLICATION(S)

The present application claims priority to U.S. Provisional Patent Application No. 63/238,084, filed Aug. 27, 2021, the disclosure of which is incorporated herein by reference in its entirety.

TECHNICAL FIELD

The present disclosure is generally related to methods for directly bonding semiconductor materials. In particular, the present technology relates to methods for improving bond strength in directly bonded materials.

BACKGROUND

Individual semiconductor dies are typically manufactured in bulk on a semiconductor wafer then separated into individual semiconductor dies. The bulk manufacturing process can increase throughput and reduce difficulties in handling individual semiconductor dies as they continue to shrink in size. Individual semiconductor dies can then be stacked to form semiconductor assemblies. Hybrid bonding, sometimes called direct bonding, describes a bonding process without any additional intermediate layers between dies. Hybrid bonding processes typically include a fusion bonding process (e.g., oxide-oxide bonding) and a metal-metal bonding process, sometimes carried out simultaneously. Fusion bonding and metal-metal bonding typically rely on chemical bonds and interactions between two surfaces. For example, a fusion bonding process for silicon is based on intermolecular interactions including van der Waals forces, hydrogen bonds, and strong covalent bonds. The direct bond between surfaces helps allow semiconductor die manufacturers meet continual demands for reduction in the volume occupied by die assemblies. However, hybrid bonding processes typically require high temperatures to even superficially bond surfaces together. The high temperatures can cause defects in the stacked semiconductor device, for example where materials with differing coefficients of thermal expansion contact each other. Further, the resulting bond can lack the required strength to meet demands for completed stacked assemblies.

Figure 1A:
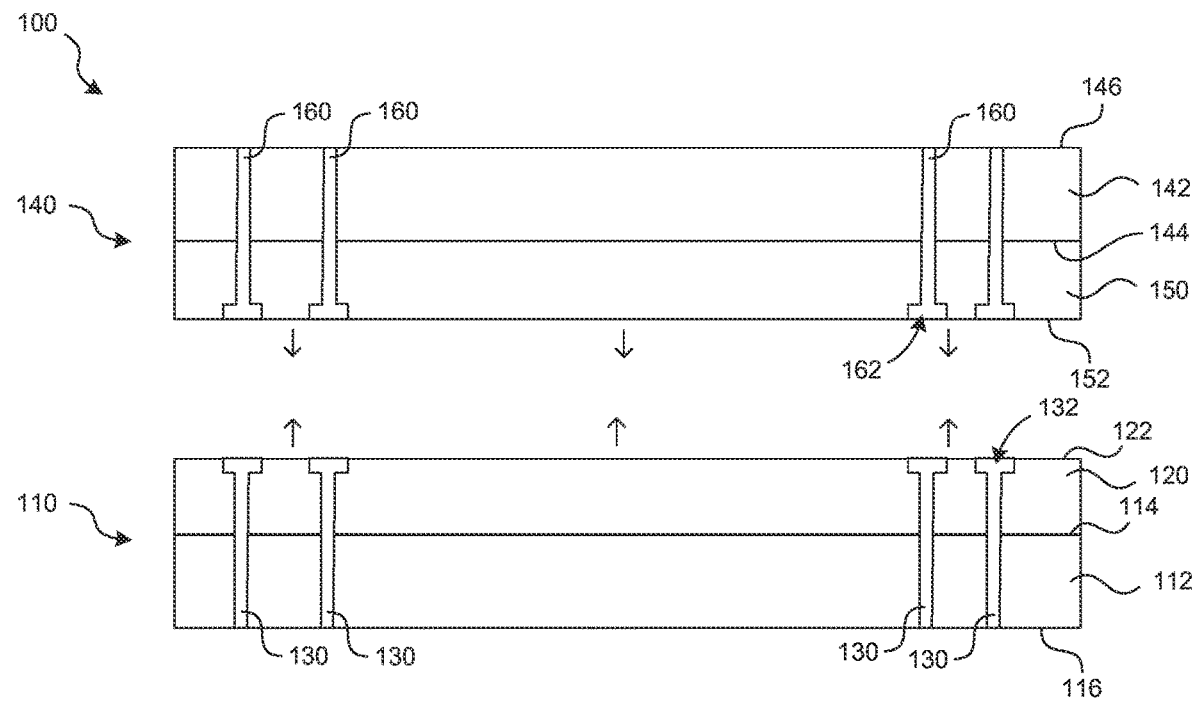
FIGS. 1A and 1B illustrate a general hybrid bonding process between two semiconductor dies in accordance with some embodiments of the present technology.

The drawings have not necessarily been drawn to scale. Similarly, some components and/or operations can be separated into different blocks or combined into a single block for the purpose of discussion of some of the implementations of the present technology. Moreover, while the technology is amenable to various modifications and alternative forms, specific implementations have been shown by way of example in the drawings and are described in detail below. The intention, however, is not to limit the technology to the particular implementations described. On the contrary, the technology is intended to cover all modifications, equivalents, and alternatives falling within the scope of the technology as defined by the appended claims.

DETAILED DESCRIPTION

Overview

A method for hybrid bonding semiconductor surfaces, resulting semiconductor devices, and associated systems and methods are disclosed. In some embodiments, the method includes depositing a first material on a first semiconductor substrate (e.g., a first die substrate). The first material has a first outer surface and a first chemical composition at the first outer surface. The method also includes depositing a second material on a second semiconductor substrate (e.g., a second die substrate). The second material has a second outer surface and a second chemical composition at the second outer surface that is different from the first chemical composition. The method also includes stacking the semiconductor substrates such that the second outer surface of the second material is in contact with the first outer surface of the first material. Once stacked, the method includes reacting the first outer surface with the second outer surface. The reaction causes the first outer surface to bond to the second outer surface, thereby bonding the first semiconductor substrate to the second semiconductor substrate.

In some embodiments, the first material and the second material are a dielectric material. The first chemical composition can contain a higher ratio of a first molecule to a second molecule than a stoichiometrically balanced ratio of molecules for the dielectric material; while the second chemical composition can contain a lower ratio of the first molecule to the second molecule than the stoichiometrically balanced ratio of molecules for the dielectric material. When the first material and the second material are stacked, the dielectrics can react to move towards the stoichiometrically balanced ratio of molecules in each dielectric, thereby bonding the dielectrics. In some embodiments the first and second materials are polymer-backed colloids. For example, the first material can be a first polymer-backed colloid having a first molecular species suspended therein, while the second material can be a second polymer-backed colloid having a second molecular species suspended therein. When the first material and the second material are stacked, the first species can react with the second species, causing the first polymer to bond with the second polymer. In some embodiments, the first and second materials are partially cured polymers with varying crosslinker concentrations. The first material can have a first crosslinker concentration lower than a preferred crosslinker concentration of the polymer, while the second material can have a second crosslinker concentration higher than the preferred crosslinker concentration of the polymer. When the first material and the second material are stacked, the first polymer can react with the second polymer to move towards the referred crosslinker concentration in each polymer, thereby bonding the polymers.

For ease of reference, the stacked semiconductor device and method of forming the same are sometimes described herein with reference to top and bottom, upper and lower, upwards and downwards, and/or horizontal plane, x-y plane, vertical, or z-direction relative to the spatial orientation of the embodiments shown in the figures. It is to be understood, however, that the stacked semiconductor device and method of forming the same can be moved to, and used in, different spatial orientations without changing the structure and/or function of the disclosed embodiments of the present technology.

Further, although primarily discussed herein as a hybrid bonding process to bond the surfaces of two semiconductor dies to form stacked semiconductor assemblies, one of skill in the art will understand that the scope of the invention is not so limited. For example, the disclosed method can also be used to bond any other surface in a semiconductor device and/or to bond surfaces within a semiconductor die. Accordingly, the scope of the invention is not confined to any subset of embodiments, and is confined only by the limitations set out in the appended claims.

DESCRIPTION OF THE FIGURES

Figure 1B:
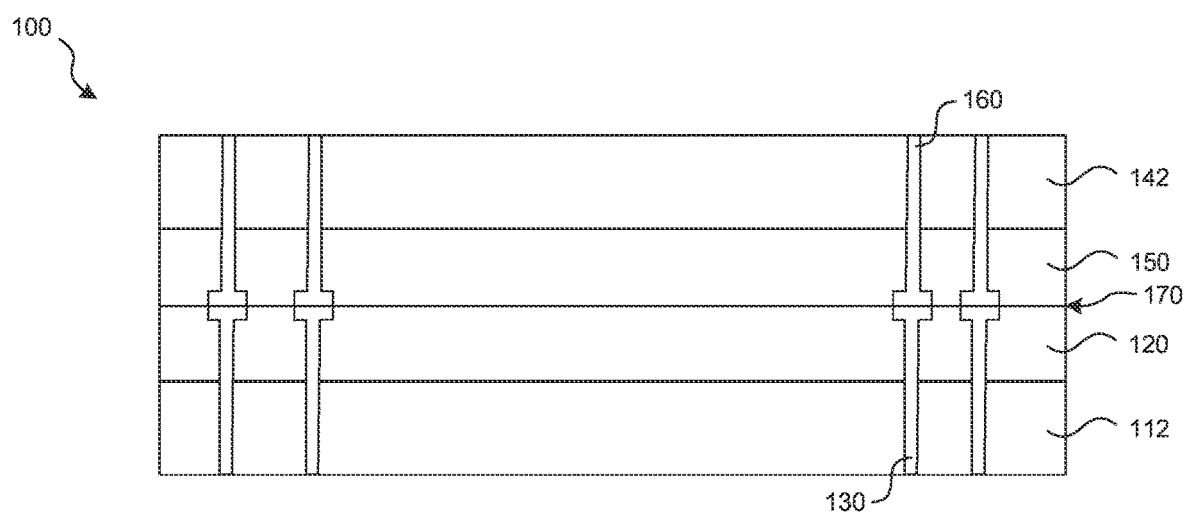

FIGS. 1A and 1B illustrate a general hybrid bonding process between a stacked semiconductor assembly 100 ("stacked assembly 100") in accordance with some embodiments of the present technology. As illustrated with reference to FIG. 1A, in some embodiments, the hybrid bonding process can occur between a first semiconductor die 110 ("first die 110") and a second semiconductor die 140 ("second die 140").

The first die 110 includes a semiconductor substrate 112 that has a first surface 114 (e.g., an upper surface) and a second surface 116 (e.g., a lower surface) opposite the first surface 114. A material 120 is deposited on the first surface 114 with a bonding surface 122 facing outwardly (e.g., upwardly) from the substrate 112. The material 120 insulates the first die 110 and facilitates bonding the first die 110 to the second die 140. As discussed in more detail below, the material 120 can be a dielectric material, a polymer backed colloid, a polymer with a crosslinker, and/or various other suitable materials. Examples of dielectrics that can be used include silicon dioxide, silicon nitride, silicon carbon nitride, polysilicon, silicon carbonate, and/or any other suitable dielectric. Examples of polymers include polypyrrole, polyaniline, polydopamine, and/or various suitable epoxy resins.

As further illustrated in FIG. 1A, the first die includes interconnect structures 130 extending from the bonding surface 122 of the material 120 towards the second surface 116 of the substrate 112. In some embodiments, the interconnect structures 130 extend fully from the bonding surface 122 to the second surface 116. In other embodiments, the interconnect structures 130 extend from the bonding surface 122 to the first surface 114 of the substrate 112 and/or to some intermediate depth between the bonding surface 122 and the second surface 116 (e.g., to the first surface 114, to a depth in the substrate 112, etc.). Further, each individual interconnect structure 130 includes a bond site 132 at the bonding surface 122. As illustrated, each bond site 132 is generally flush with the bonding surface 122 of the material 120, thereby providing a generally flat surface for bonding with the second die 140.

In the illustrated embodiment, each bond site 132 is illustrated with a bond pad shape, having a wider diameter than the remainder of the corresponding interconnect structure 130. The larger diameter of the bond site 132 can help facilitate bonding to a corresponding electrical feature in the second die 140 (e.g., as discussed below, a corresponding interconnect structure 160). In some embodiments, each bond site 132 can have a different size and/or shape. For example, in various embodiments, the bond sites 132 can have a diameter generally corresponding to the diameter of the interconnect structure 130, varying diameters (e.g., based on the location on the first die 110), and/or can have varying shapes when viewed from above. In some embodiments, each bond site 132 can be an exposed portion of the interconnect structure 130 at the bonding surface 122.

In some embodiments, the interconnect structures 130 can be made from copper, nickel, conductor-filled epoxy, and/or other electrically conductive materials. In some embodiments, the interconnect structures 130 can be surrounded by an insulator to electrically isolate the interconnect structures 130 from the substrate 112. In some embodiments, the bond sites 132 can also be made from copper, nickel, conductor-filled epoxy, and/or other electrically conductive materials. In some embodiments, the interconnect structures 130 and the bond sites 132 can be made from the same material (e.g., when a bond site is a continuation of the interconnect structure). For example, the interconnect structures 130 and the bond sites 132 can both be made from copper. In some such embodiments, the interconnect structures 130 and the bond sites 132 can be formed in a single step. In other embodiments, they can be formed in separate steps. In some embodiments, the interconnect structures 130 and the bond sites 132 can be made from differing materials. For example, the interconnect structures 130 can be made from nickel while the bond sites 132 can be made from copper.

Similar to above, the second die 140 includes a semiconductor substrate 142 that has a first surface 144 (e.g., a lower surface) and a second surface 146 (e.g., an upper surface) opposite the first surface 144. A material 150 is deposited on the first surface 144 with a bond surface 152 facing outwardly from the substrate 142. The material 150 insulates the second die 140 and facilitates bonding the second die 140 to the first die 110. The material 150 can correspond to the first material 120, such as a corresponding dielectric, a corresponding polymer, and/or various other suitable materials.

The second die also includes interconnect structures 160 extending from the bond surface 152 of the material 150 towards the second surface 146 of the substrate 142. In some embodiments, the interconnect structures 160 extend fully from the bond surface 152 to the second surface 146. In other embodiments, the interconnect structures 160 extend from the bond surface 152 to the first surface 144 and/or to some intermediate depth therebetween (e.g., to the first surface 144, to a depth in the substrate 142, etc.). Further, each individual interconnect structure 160 includes a bond site 162 at the bond surface 152. As illustrated, each bond site 162 is generally flush with the bond surface 152 of the material 150, thereby providing a generally flat surface for bonding with the first die 110. In various embodiments, each bond site 162 can have a diameter generally corresponding to the diameter of the interconnect structure 160, varying diameters (e.g., based on the location on the first die 140), can be an exposed portion of the interconnect structure 160 at the bonding surface 152, and/or can have varying shapes when viewed from above.

Further, in various embodiments, the interconnect structures 160 and/or bond sites 162 can be made from copper, nickel, conductor-filled epoxy, and/or other electrically conductive materials. In some embodiments, the interconnect structures 160 can be surrounded by an insulator to electrically isolate the interconnect structures 160 from the substrate 142. In some embodiments, the interconnect structures 160 and the bond sites 162 can be made from the same material (e.g., when a bond site is a continuation of the interconnect structure). In some embodiments, the interconnect structures 160 and the bond sites 162 can be made from differing materials.

As illustrated by arrows in FIG. 1A, the hybrid bonding process includes stacking the second die 140 on the first die 110 to form the stacked assembly 100. Within the stacked assembly 100, as illustrated in FIG. 1B, the material 120 of the first die 110 is in direct contact with the material 150 from the second die 140 at bonding interface 170. In a typical hybrid bonding process, the stacked assembly 100 is then heated and put under pressure to join the material 120 to the material 150 at the bonding interface. In a typical hybrid bonding process, the materials 120, 150 are intentionally non-reactive materials (e.g., inert dielectrics). The non-reactive materials avoid reactions that could reduce the lifespan of resulting stacked assemblies, interfere with the performance of resulting stacked assemblies, and/or reduce manufacturing throughput. However, the non-reactive materials require extremely high temperatures and/or high pressure to form a direct bond between the materials, which can be have various detrimental effects on the components of the stacked assemblies.

Instead, as discussed in more detail below, the hybrid process of the present technology can include depositing slightly reactive materials and/or layers in the materials to encourage chemical or physical (e.g., diffusive) reactions to occur at lower temperatures and pressures. In some embodiments, for example, the material 120 can be a dielectric with a slightly imbalanced molecular ratio, such as excess silicon in a silicon dioxide dielectric; while the material 150 can be a dielectric with a slight oppositely imbalanced molecular ratio, such as excess oxygen in a silicon dioxide dielectric. The excess silicon in the material 120 reacts with the excess oxygen in the material 150 at lower temperatures to form silicon dioxide. The resulting combination reaction thereby bonds the material 120 to the material 150 at significantly lower temperatures and pressures, thereby increasing manufacturing throughput and the lifespan of resulting stacked assemblies. The reaction can also result in a much stronger bond than is formed between non-reactive surfaces, thereby further increasing manufacturing throughput and the lifespan of resulting stacked assemblies. As discussed in more detail below, the materials used to result in reactive surfaces between the first die 110 and the second die 140 can include various doped-dielectrics and/or doped polymers. In some embodiments, the amount of doping is also varied according to the depth within the material.

Figure 2A:
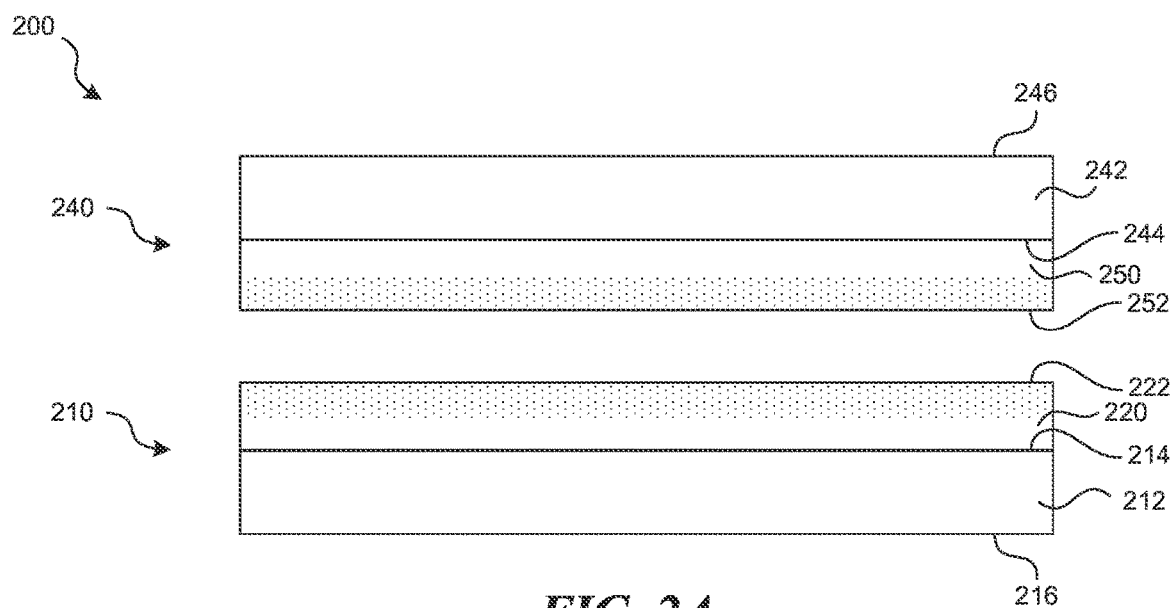
FIGS. 2A-2C illustrate a fusion bonding aspect of a hybrid bonding process using reactive dielectrics in accordance with some embodiments of the present technology.
Figure 2B:
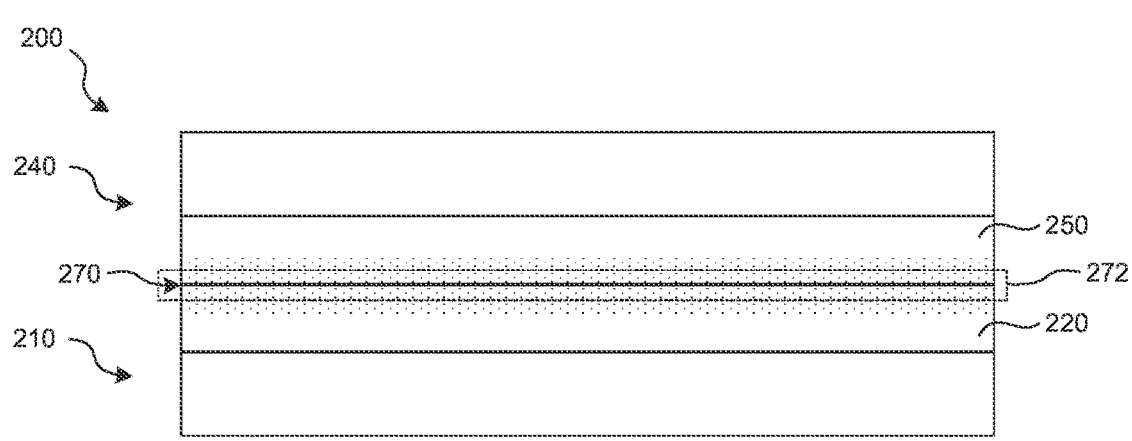
Figure 2C:
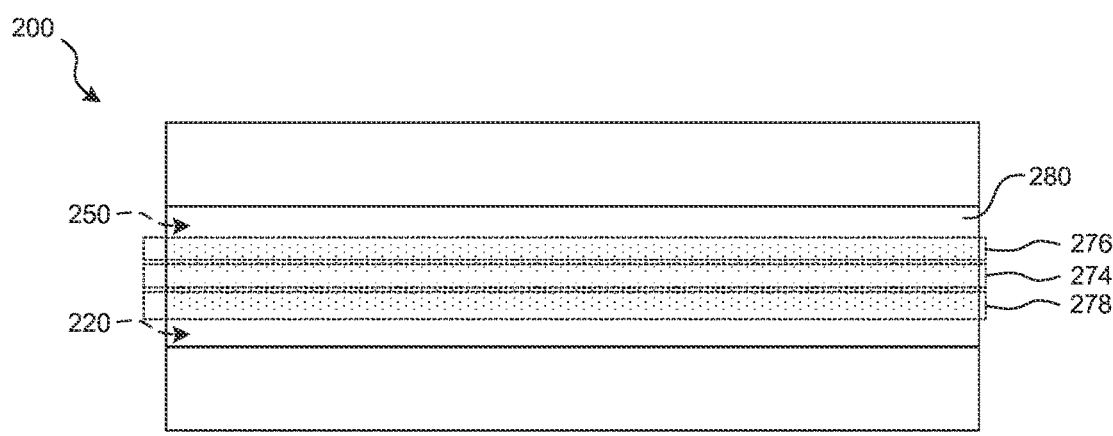

FIGS. 2A-2C illustrate a fusion bonding aspect of a hybrid bonding process using reactive dielectrics in accordance with some embodiments of the present technology. As illustrated with respect to FIG. 2A, the stacked assembly 200 includes components generally similar to those discussed above with respect to FIGS. 1A and 1B. For example, the stacked assembly 200 includes a first die 210 and a second die 240. The first die 210 includes a semiconductor substrate 212 and a with a first surface 214 and a second surface 216 opposite the first surface. A first dielectric 220 is disposed on the first surface 214 of the substrate 212. Similarly, the second die 240 includes a semiconductor substrate 242 and a with a first surface 244 and a second surface 246 opposite the first surface 244. A second dielectric 250 is disposed on the first surface 244 of the substrate 242. The interconnect structures 130, 160 (e.g., FIGS. 1A and 1B) are omitted to avoid obscuring the discussion herein.

The first dielectric 220 includes a bonding surface 222 facing outwardly from the first die 210. The bonding surface 222 has a first chemical composition that has a ratio of molecules that is at least partially divergent from a stoichiometrically balanced ratio of the molecules for the dielectric. For example, the first dielectric 220 can be silicon dioxide with a stoichiometrically balanced ratio of one silicon per two oxygen (denoted herein by $SiO_2$), while the bonding surface 222 can contain less than two oxygen per one silicon. In various embodiments, for example, the dielectric can contain about one oxygen per one silicon (denoted herein by $SiO_1$), about 1.5 oxygen per one silicon (denoted herein by $SiO_{1.5}$), about 1.8 oxygen per one silicon (denoted herein by $SiO_{1.8}$), about 1.9 oxygen per one silicon (denoted herein by $SiO_{1.9}$), about 1.95 oxygen per one silicon (denoted herein by $SiO_{1.95}$), or about 1.99 oxygen per one silicon (denoted herein by $SiO_{1.99}$). As a result, the first dielectric 220 contains non-bonded silicon molecules at the bonding surface 222, which are available to react with an appropriate species.

The second dielectric 250 includes a bonding surface 252 facing outwardly from the second die 240. The bonding surface 252 has a second chemical composition, with a ratio of molecules that is at least partially divergent from a stoichiometrically balanced ratio of the molecules for the dielectric. The second chemical composition diverges from the stoichiometrically balanced ratio in the opposite direction from the first chemical composition. Returning to the example above, the second dielectric 250 can be a silicon dioxide with the bonding surface 252 containing more than two oxygen per one silicon. For example, in some embodiments the bonding surface 252 can contain about three oxygen per one silicon (denoted herein by $SiO_3$), about 2.5 oxygen per one silicon (denoted herein by $SiO_{2.5}$), about 2.2 oxygen per one silicon (denoted herein by $SiO_{2.2}$), about 2.1 oxygen per one silicon (denoted herein by $SiO_{2.1}$), about 2.05 oxygen per one silicon (denoted herein by $SiO_{2.05}$), or about 2.01 oxygen per one silicon (denoted herein by $SiO_{2.01}$). As a result, the second dielectric 250 contains non-bonded oxygen molecules at the bonding surface 252, which are available to react with an appropriate species.

In the illustrated embodiment, the first and second dielectrics 220, 250 have a sub-layer at the bonding surfaces 222, 252 with the respective chemical compositions. In some embodiments, the respective chemical compositions are present throughout the first and second dielectrics 220, 250. In some embodiments, the first and second dielectrics 220, 250 include a transition (e.g., a gradient, gradual steps, or other suitable transition) between the chemical composition at the bonding surfaces 222, 252 and the chemical composition adjacent the first and second dies 210, 240. For example, in some embodiments, the first dielectric 220 has a stoichiometrically imbalanced ratio of molecules at the bonding surface 222, the stoichiometrically balanced ratio of molecules adjacent the substrate 212, and a transition (e.g., a gradient) between the substrate 212 and the bonding surface 222.

In some embodiments, the first and second dielectrics 220, 250 can be deposited by varying a typical chemical vapor deposition ("CVD") process. In such embodiments, the stoichiometric imbalance in the ratio of the molecules in the dielectric can be created by varying the ratio of gases during the vapor deposition. Returning to the silicon dioxide example, the ratio of silicon particles to oxygen gas can be intentionally varied to leave non-bonded oxygen and/or silicon in the resulting dielectric layer. In some embodiments, the CVD process can be varied in a step fashion, resulting in a first sub-layer with a stoichiometrically balanced ratio of molecules and a second sub-layer with a stoichiometrically imbalanced ratio of molecules. In some embodiments, the CVD process can be dynamically varied, resulting in a transition from a stoichiometrically balanced ratio of molecules to a stoichiometrically imbalanced ratio of molecules.

In some embodiments, the first and second dielectrics 220, 250 can be deposited by varying a typical spin-coating process (e.g., spin on dielectric or spin on glass processes). For example, the ratio of the materials used during the spin coating can be intentionally varied to increase the ratio of silicon to oxygen and/or increase the ratio of oxygen to silicon. In some embodiments, the spin coating process can include varying a curing temperature for the spun-on material, which effects the ratio of molecules that set up in the dielectric near the surface of the dielectric. Returning to the silicon dioxide example, the spin coating process can include depositing a silicon oxide precursor and curing the precursor in the presence of oxygen gas to form silicon dioxide. By varying the curing temperature, the spin coating process can reduce the number of molecules in the precursor that form silicon dioxide, leaving behind silicon oxide molecules and a stoichiometrically imbalanced ratio of molecules for a silicon dioxide material. In some embodiments, the curing temperature can be varied in steps, resulting in a first sub-layer with the stoichiometrically balanced ratio of molecules and a second sub-layer with a stoichiometrically imbalanced ratio of molecules. In some embodiments, the curing temperature can be dynamically varied through the process, resulting in a transition from the stoichiometrically balanced ratio of molecules to a stoichiometrically imbalanced ratio of molecules.

As illustrated with respect to FIG. 2B, the hybrid bonding process includes stacking the second die 240 on the first die 210 with the first and second dielectrics 220, 250 in contact at a bonding interface 270. Once stacked, the hybrid bonding process can react a portion of the first dielectric 220 and a portion of the second dielectric 250 within region 272 adjacent the bonding interface 270. For example, in embodiments in which the first and second dielectrics 220, 250 are silicon dioxide that diverge from the stoichiometrically balanced ratio ($SiO_2$) in the opposite direction, the hybrid bonding process can include reacting the non-bonded silicon molecules with the non-bonded oxygen molecules to form silicon dioxide.

In some embodiments, the reaction is exergonic, such that the first and second dielectrics 220, 250 begin to react on contact. For example, the reaction can be exothermic, thereby releasing a small amount of heat during the reaction. In some embodiments, the reaction is endergonic and requires some activation energy to initiate. In such embodiments, the hybrid bonding process can include providing an activation energy to the stacked dies. For example, the hybrid bonding process can include providing a small amount of heat to activate the reaction, an electrical activation energy, a small amount of pressure to the stacked dies, and/or any other suitable form of activation energy. In some embodiments, the hybrid bonding process can include supplying energy (e.g., thermal, electrical, and/or pressure) to act as a catalyst to the reaction. For example, the hybrid bonding process can include supplying an electrical catalyst that speeds up the reaction to form the bond between the first and second dielectrics 220, 250.

During the reaction, molecules in the first dielectric 220 combine with molecules in the second dielectric 250 to bring the molecular ratio in the region 272 towards the stoichiometrically balanced ratio for the dielectric. As a result, a portion of the molecules from the first dielectric 220 can move into the second dielectric 250 and/or a portion of the molecules from the second dielectric 250 can move into the first dielectric 220 (e.g., thereby diffusing material from the first dielectric 220 into the second dielectric and vice-versa). The movement of molecules between the first and second dielectrics 220, 250 and the combination of molecules along the bonding interface 270 results in a strong bond between the first and second dielectrics 220, 250.

An example of the result of the reaction is illustrated in FIG. 2C. As illustrated, the combination and movement of molecules between the first and second dielectrics 220, 250 bonds the first dielectric 220 and the second dielectric 250 in the region 274 to form a continuous dielectric 280. In the illustrated embodiment, the reaction completely bonds the first and second dielectrics 220, 250 along the bonding interface 270 (FIG. 2B), such that the bonding interface 270 disappears. In some embodiments, as discussed in more detail below with respect to FIG. 6, the first and second dielectrics 220, 250 can have altered molecular ratios in pre-defined positions along their respective bonding surfaces 222, 252 (FIG. 2A), leaving non-bonded regions in the non-altered regions. For example, the first and second dielectrics 220, 250 can be bonded between interconnect structures to avoid interference from the reaction with the electrical connection between the interconnect structures.

As further illustrated in FIG. 2C, in some embodiments, the reaction leaves behind traces of the pre-reaction chemical compositions within the first and second dielectrics 220, 250. That is, while the dielectric 280 can have the stoichiometrically balanced ratio of molecules within the region 274, regions further from the bonding interface 270 (FIG. 2B) may not react fully (or at all), leaving behind regions having the previous molecular ratio. Returning to the silicon dioxide example, the region 276 may still contain more than one silicon per two oxygen, while the region 278 may still contain more than two oxygen per one silicon. In some embodiments, the reaction can completely consume the excess molecules, thereby leaving nothing but the stoichiometrically balanced ratio in the dielectric 280.

Figure 3A:
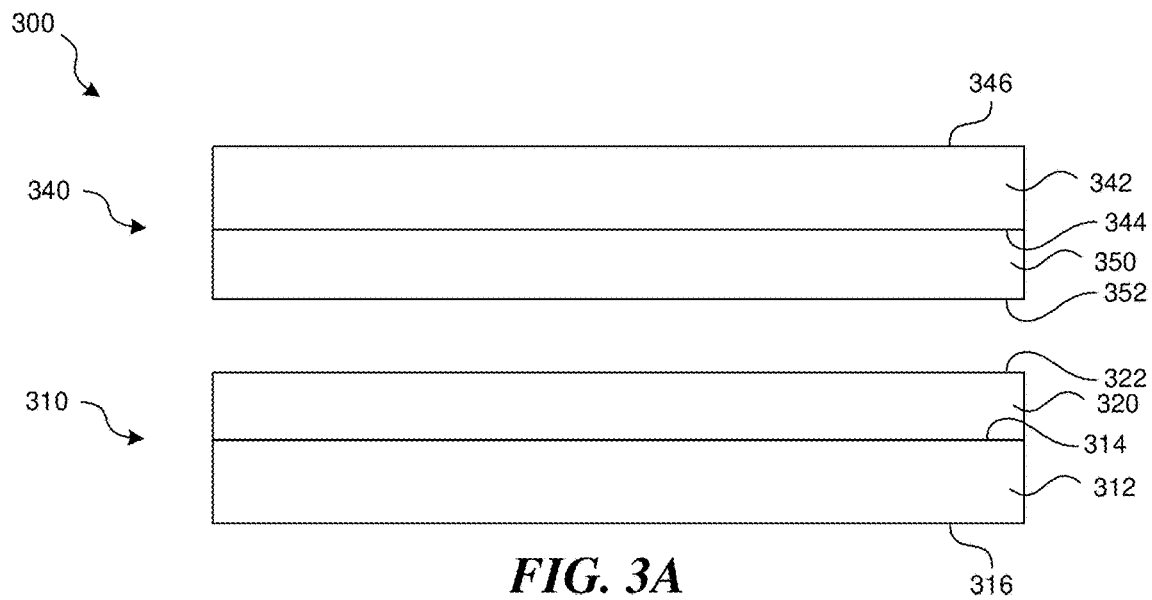
FIGS. 3A-3C illustrate a fusion bonding aspect of a hybrid bonding process using reactive polymers in accordance with some embodiments of the present technology.
Figure 3B:
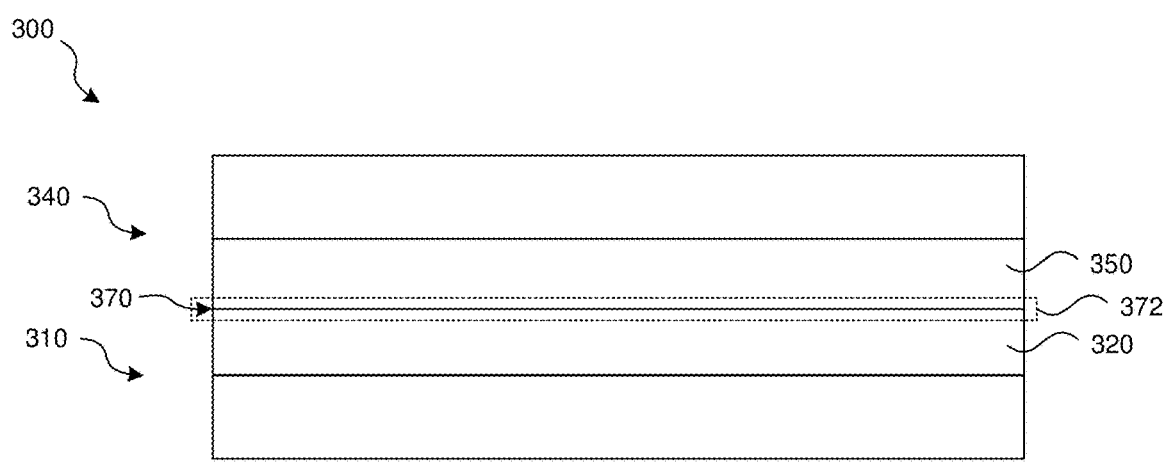
Figure 3C:
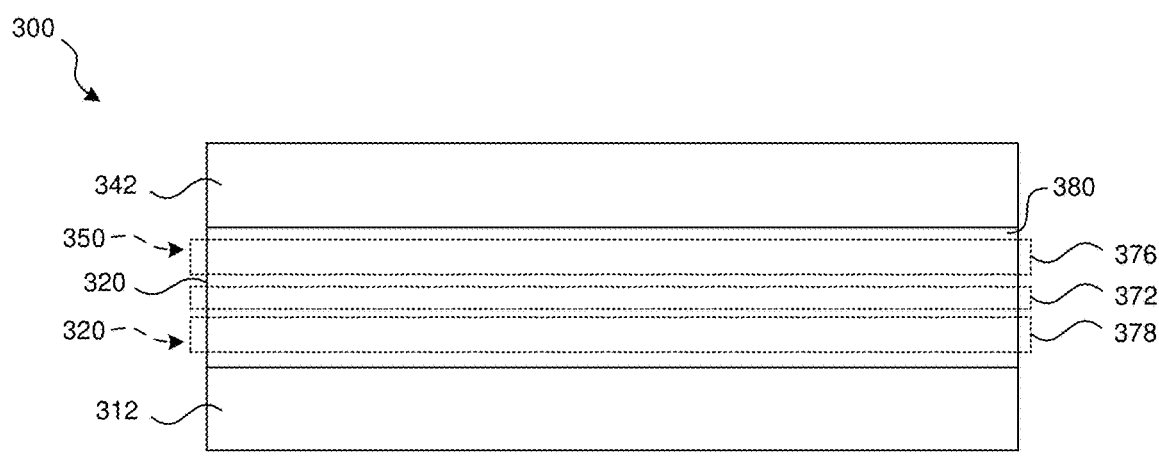

FIGS. 3A-3C illustrate a fusion bonding aspect of a hybrid bonding process using reactive polymers in accordance with some embodiments of the present technology. As illustrated with respect to FIG. 3A, the stacked assembly 300 includes components generally similar to those discussed above with respect to FIGS. 1A and 1B. For example, the stacked assembly 300 includes a first die 310 and a second die 340. The first die 310 includes a semiconductor substrate 312 and a with a first surface 314 and a second surface 316 opposite the first surface. A first polymer material 320 is disposed on the first surface 314 of the substrate 312. Similarly, the second die 340 includes a semiconductor substrate 342 and a with a first surface 344 and a second surface 346 opposite the first surface. A second polymer material 350 is disposed on the first surface 344 of the substrate 342. The interconnect structures 130, 160 (e.g., FIG. 1A) are omitted to avoid obscuring the discussion herein.

The first polymer material 320 includes a bonding surface 322 facing outwardly (e.g., upwardly) from the first die 310. The first polymer material 320 has a chemical composition at the bonding surface 322. Similarly, the second polymer material 350 includes a bonding surface 352 facing outwardly (e.g., downwardly) from the second die 340. The second polymer material 350 has a chemical composition at the bonding surface 352 that is different from the chemical composition at the bonding surface 322.

For example, in some embodiments, the first and second polymer materials 320, 350 are colloids. The first polymer material 320 can include a first molecular species (e.g., chemical 'A') suspended within the polymer, while the second polymer material 350 can include a second molecular species (e.g., chemical 'B') suspended within the polymer that is reactive when exposed to the first molecular species. In some embodiments, for example, exposing the second chemical to the first chemical can cause a combination reaction (e.g., A+B→AB) that produces a third molecular species suspended within the polymer.

In some embodiments, the first and second polymer materials 320, 350 are partially cured polymers with crosslinker concentrations that are divergent from a preferred crosslinker concentration for the polymer material. In some such embodiments, the first polymer material 320 has a crosslinker concentration less than the preferred crosslinker concentration while the second polymer material 350 has a crosslinker concentration more than the preferred crosslinker concentration. Examples of polymers that can be used in crosslinker embodiments include polypyrrole, polyaniline, polydopamine, and/or various suitable epoxy resins.

In some embodiments, the second polymer materials 320, 350 have a sub-layer at the bonding surfaces 322. 352 with the respective chemical compositions. In some embodiments, the respective chemical compositions are present throughout the first and second polymer materials 320, 350. In some embodiments, the first and second polymer materials 320, 350 include a transition (e.g., a gradient, gradual steps, or other suitable transition) between the chemical composition at the bonding surfaces 322, 352 and the chemical composition adjacent the first and second dies 310, 340 For example, in some embodiments, the first polymer material 320 has a crosslinker concentration less than the preferred crosslinker concentration for the polymer at the bonding surface 322, the preferred crosslinker concentration adjacent the first die 310, and a transition between the first die 310 and the bonding surface 322.

As illustrated with respect to FIG. 3B, the hybrid bonding process includes stacking the second die 340 on the first die 310 with the first and second polymer materials 320, 350 in contact at a bonding interface 370. Similar to the discussion above with respect to FIG. 2B, once stacked, the hybrid bonding process includes reacting a portion of the first polymer material 320 and a portion of the second polymer material 350 within region 372 adjacent the bonding interface 370. For example, in embodiments in which the first and second polymer materials 320, 350 are colloids, the hybrid bonding process includes reacting the molecular species suspended in the first polymer material 320 with the molecular species suspended in the second polymer material 350.

In some embodiments, the reaction is exergonic, such that the first and second polymer materials 320, 350 begin to react on contact. In other embodiments, the reaction is endergonic and requires some activation energy to initiate. Accordingly, the hybrid bonding process can include providing an activation energy to the stacked assembly 300. For example, the hybrid bonding process can include providing heat energy, electrical energy, a compression pressure, and/or any other suitable form of activation energy. In some embodiments, the hybrid bonding process can include supplying energy (e.g., thermal, electrical, and/or pressure) to act as a catalyst to the reaction. For example, the hybrid bonding process can include supplying an electrical catalyst that speeds up the reaction to form the bond between the first and second polymer materials 320, 350.

An example of the result of the reaction is illustrated in FIG. 3C. As illustrated, the combination and movement of molecules between the first and second polymer materials 320, 350 bonds the first polymer material 320 and the second polymer material 350 in the region 274 to form a continuous polymer material 380. In the illustrated embodiment, the reaction completely bonds the first and second polymer materials 320, 350 along the bonding interface 370 (FIG. 3B). In some embodiments, as discussed in more below with respect to FIG. 6, the bonding surfaces 322, 352 of the first and second polymer materials 320, 350 can have pre-defined bonding regions predefined non-bonded regions.

In some embodiments, the reaction leaves behind traces of the pre-reaction chemical compositions within the first and second polymer materials 320, 350. For example, while the polymer material 380 can the preferred crosslinker concentration within the region 372, regions further from the bonding interface 370 (FIG. 3B) may not react fully (or not react at all), leaving behind regions having the previous chemical compositions. For example, the region 376 may still have a lower crosslinker concentration than the preferred crosslinker concentration, while the region 378 may still have a higher crosslinker concentration than the preferred crosslinker concentration. In some embodiments, the reaction can completely consume the reactive compositions, thereby resulting in the polymer material 380 being generally homogenous between the first die 310 and the second die 340.

Figure 4A:
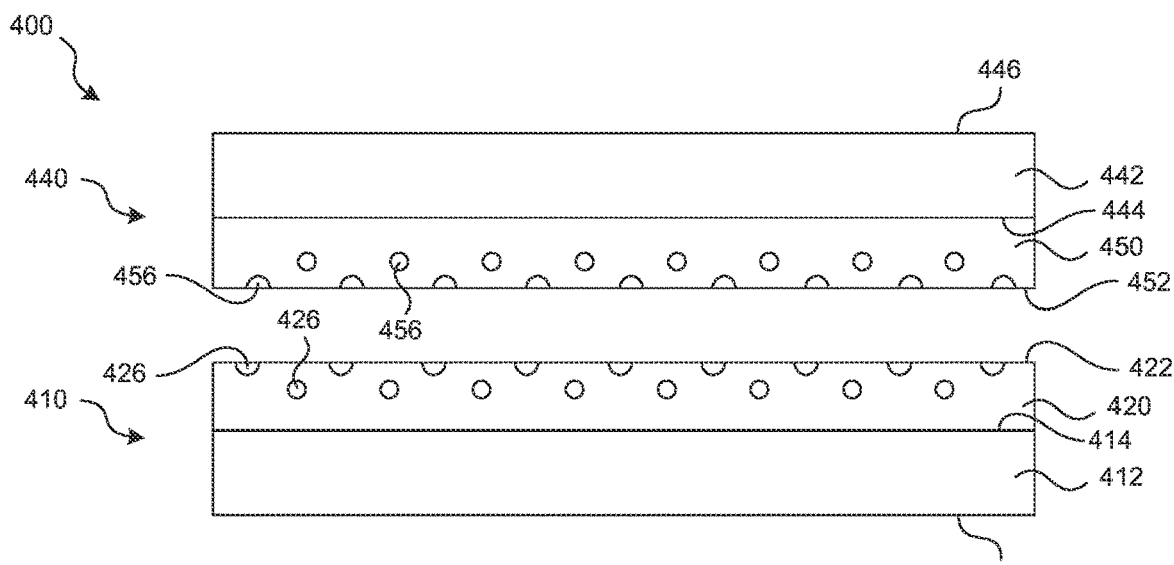
FIGS. 4A-4C illustrate a fusion bonding aspect of a hybrid bonding process using reactive materials deposited in pores of a material on each semiconductor die in accordance with some embodiments of the present technology.
Figure 4B:
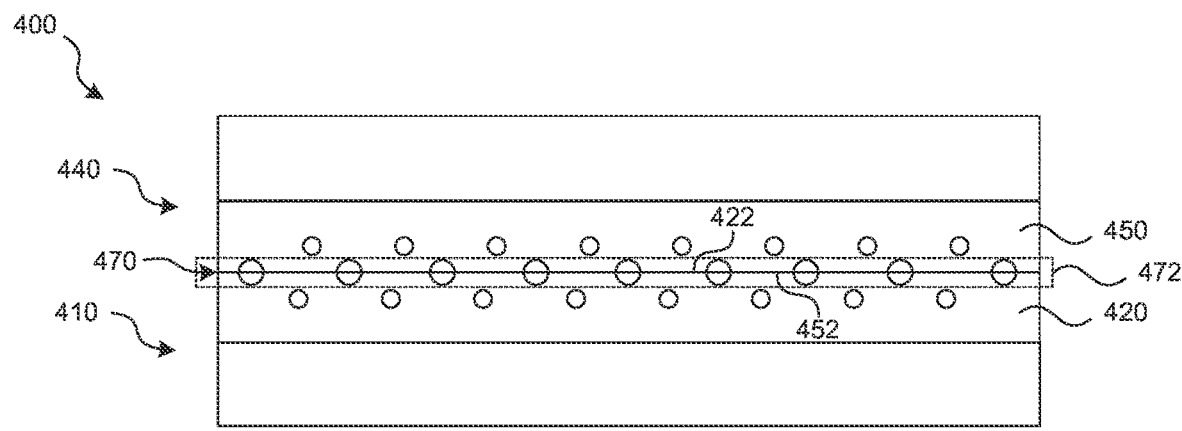
Figure 4C:
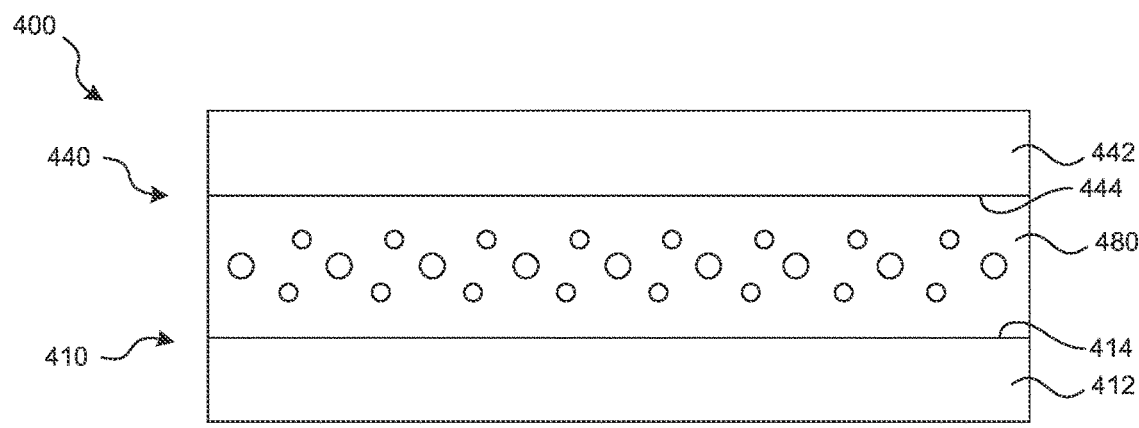

FIGS. 4A-4C illustrate a fusion bonding aspect of a hybrid bonding process using reactive materials deposited in pores of a material on each semiconductor die in accordance with some embodiments of the present technology. As illustrated with respect to FIG. 4A, the stacked assembly 400 includes components generally similar to those discussed above with respect to FIGS. 1A and 1B. For example, the stacked assembly 400 includes a first die 410 and a second die 440. The first die 410 includes a semiconductor substrate 412 and a with a first surface 414 and a second surface 416 opposite the first surface. A first material 420 is disposed on the first surface 414 of the substrate 412. Similarly, the second die 440 includes a semiconductor substrate 442 and a with a first surface 444 and a second surface 446 opposite the first surface 444. A second material 450 is disposed on the first surface 444 of the substrate 442. The interconnect structures 130, 160 (e.g., FIG. 1A) are omitted to avoid obscuring the discussion herein.

As illustrated in FIG. 4A, the first material 420 can include one or more pores 426 at a bonding surface 422 of the first material 420, as well as one or more pores 426 beneath the bonding surface 422. The first material 420 can be a dielectric, polymer, or other suitable material. The pores 426 result from errors during manufacturing and are ordinarily defects in the material that are carefully avoided. Instead of avoiding the pores, the hybrid bonding process of the present technology can include intentionally allowing the pores 426 to form, then doping the pores 426 with a chemical constituent (e.g., a chemical 'A'). Similarly, the second material 450 can include one or more pores 456 at a bonding surface 452 of the second material 450, as well as one or more pores 456 beneath the bonding surface 452. In various embodiments, the second material 450 can also be a dielectric, a polymer, or other suitable material. Further, the hybrid bonding process can include intentionally allowing the pores 456 to form, then doping the pores 456 with a chemical constituent (e.g., a chemical 'B' that is reactive with chemical A). In some embodiments, for example, exposing the second chemical to the first chemical can cause a combination reaction (e.g., A+B→AB).

As illustrated in FIG. 4B, once the pores 426, 456 are formed and doped, the hybrid bonding process includes stacking the second die 440 on the first die 410 with the first and second materials 420, 450 in contact at a bonding interface 470. Once stacked, the hybrid bonding process includes reacting the chemicals deposited in the pores 426, 456 at the bonding surfaces 422, 452. In some embodiments, the reaction is exergonic. In other embodiments, the reaction is endergonic and requires some activation energy to initiate. Accordingly, the hybrid bonding process can include providing an activation energy to the stacked assembly 400. For example, the hybrid bonding process can include providing heat energy, electrical energy, a compression pressure, and/or any other suitable form of activation energy. In some embodiments, the hybrid bonding process can include supplying energy (e.g., thermal, electrical, and/or pressure) to act as a catalyst to the reaction. For example, the hybrid bonding process can include supplying an electrical catalyst that speeds up the reaction to form the bond between the first and second materials 420, 450.

The reaction causes a portion of the first material 420 and a portion of the second material 450 within region 472 adjacent the bonding interface 470 to bond. For example, heat released by the reaction can cause a portion of the first material 420 to migrate into the second material 450; a portion of the second material 450 to migrate into the first material 420; and/or cause the chemicals deposited in the pores 426, 456 to form internal bonding structures that help bond the first and second materials 420, 450 together.

As illustrated with respect to FIG. 4C, the result of the reaction is a stacked assembly 400 that includes the substrate 412 of the first die 410, the substrate 442 of the second die 440 carried by the substrate 412, and a cohesive bonding material 480 between the substrates 412, 442. The cohesive bonding material 480 is attached to the first surface 414 of the substrate 412 and the first surface 444 of the substrate 442, thereby forming a direct bond between the first and second dies 410, 440. In some embodiments, the bonding material 480 includes buried pores adjacent the substrate 412 with unreacted volumes of the first chemical constituent. In some embodiments, the bonding material 480 includes buried pores adjacent the substrate 442 with unreacted volumes of the second chemical constituent. In some embodiments, the reaction fully consumes the first and second chemical constituent, such that the bonding material 480 includes buried pores with the reaction's product.

In some embodiments, for example as illustrated in FIG. 4C, the bonding material 480 contains no trace of the previous bonding interface 470 (FIG. 4B). In other embodiments, the bonding material 480 contains regions in which the bonding interface 470 remains. For example, as discussed in more detail below with respect to FIG. 6, each of the first and second materials 420, 450 (FIG. 4A) can have pre-defined reactive regions that are doped with the chemical constituents to cause the reaction, and pre-defined non-reactive regions that do not react when the first die 410 and the second die 440 are stacked. In some embodiments, the non-reactive regions contain pores that are doped with a non-reactive chemical constituent. In some embodiments, the non-reactive regions are formed without pores to be doped.

Figure 5A:
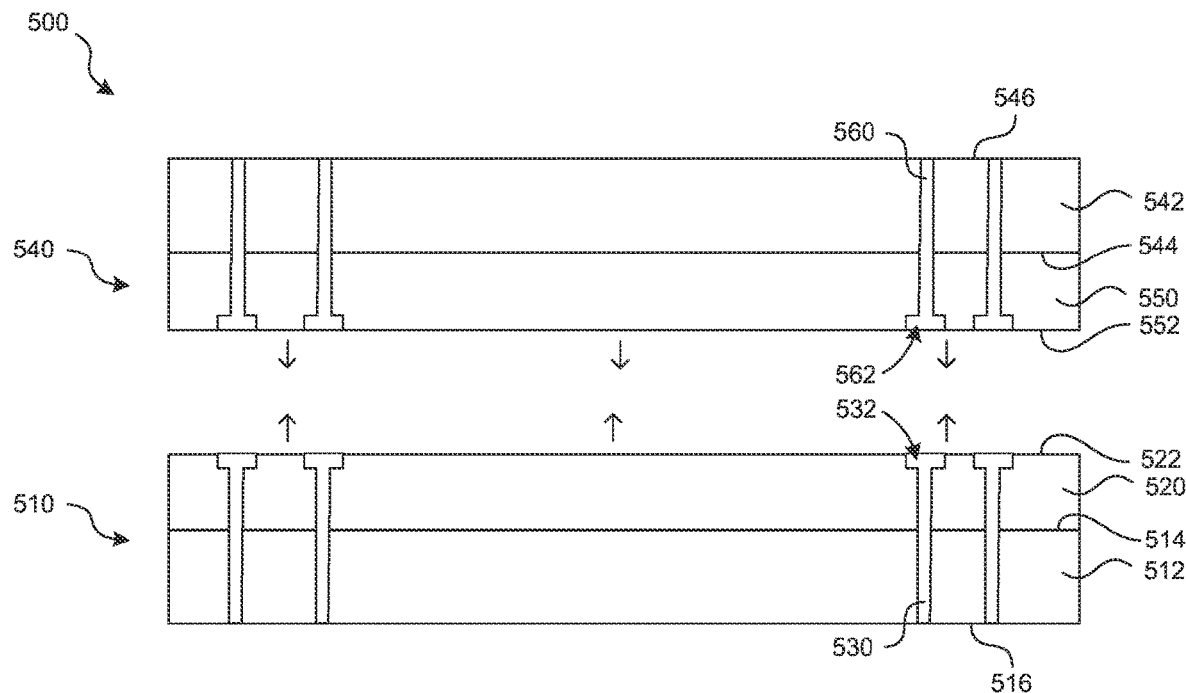
FIGS. 5A and 5B illustrate a hybrid bonding process between using reactive materials in accordance with some embodiments of the present technology.
Figure 5B:
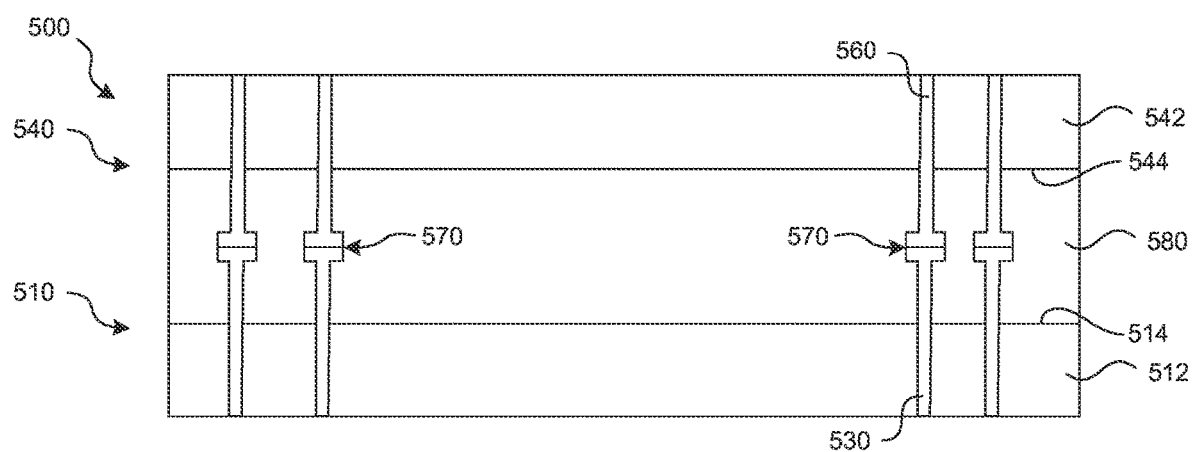

FIGS. 5A and 5B illustrate a hybrid bonding process between using reactive materials in accordance with some embodiments of the present technology. Additional details on the hybrid bonding process are described below with respect to FIG. 7.

As illustrated with respect to FIG. 5A, the stacked assembly 500 includes components generally similar to those discussed above with respect to FIGS. 1A and 1B. For example, the stacked assembly 500 includes a first die 510 and a second die 540. The first die 510 includes a semiconductor substrate 512 and a with a first surface 514 and a second surface 516 opposite the first surface. A first material 520 is disposed on the first surface 514 of the substrate 512. The first material 520 includes a bonding surface 522 that has a first chemical composition. Similarly, the second die 540 includes a semiconductor substrate 542 and a with a first surface 544 and a second surface 546 opposite the first surface. A second material 550 is disposed on the first surface 544 of the substrate 542. The second material 550 includes a bonding surface 552 that has a second chemical composition that is different from the first chemical composition.

As discussed in detail above, the first chemical composition of the first material 520 can be reactive with the second chemical composition of the second material 550. The hybrid bonding process can utilize the reaction between the chemical compositions to bond the first and second materials 520, 550. Accordingly, the hybrid bonding process includes stacking the second die 540non the first die 510 to form the stacked assembly 500. As illustrated with respect to FIG. 5A, the stacking process can include an aligning step that ensures bonding sites 532 of interconnect structures 530 in the first die 510 are aligned with corresponding bonding sites 562 of interconnect structures 560 in the second die 540 in the stacked assembly 500.

FIG. 5B illustrates a result of the hybrid bonding process. As illustrated, the result of the reaction is a stacked assembly 500 that includes the substrate 512 of the first die 510, the substrate 542 of the second die 540 carried by the substrate 512, and a cohesive bonding material 580 between the substrates 512, 542. The bonding material 580 is attached to the first surface 514 of the substrate 512 and the first surface 544 of the substrate 542, thereby forming a direct bond between the first and second dies 510, 540.

As further illustrated in FIG. 5B, individual interconnect structures 530 from the first die 510 contact individual interconnect structures 560 from the second die 540 within the bonding material 580. In the illustrated embodiment, the interconnect structures 530, 560 contact each other at the remaining bonding interface 570. In some embodiments, the heat from the reaction can anneal the interconnect structures 530, 560, further reinforcing the bond between the first and second dies 510, 540. In some embodiments in which the bonding interface 570 remains between the interconnect structures 530, 560, the hybrid bonding process can then include an annealing process to fully join the interconnect structures 530, 560 at the bonding interface 570. For example, the hybrid bonding process can include heating the stacked assembly 500 to a reflow temperature.

Figure 6:
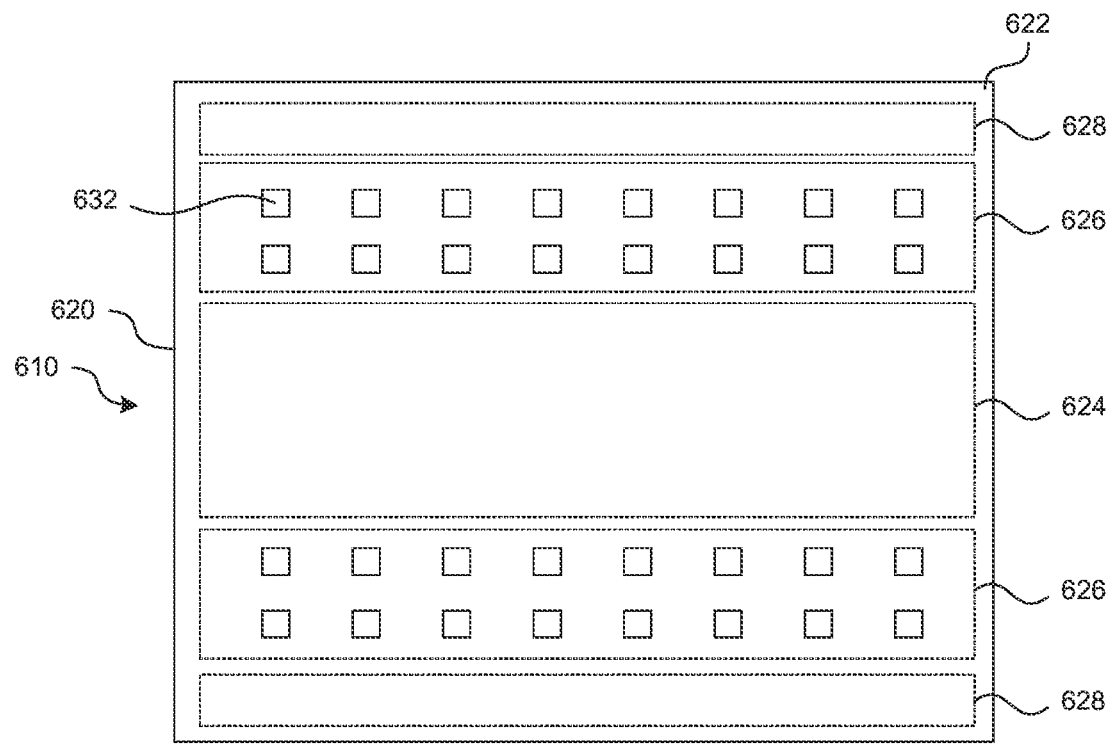
FIG. 6 is a top plan view of a semiconductor die with a reactive material deposited thereon in accordance with some embodiments of the present technology.

FIG. 6 is a top plan view of a semiconductor die 610 with a material 620 deposited thereon in accordance with some embodiments of the present technology. In the illustrated embodiment, the material 620 includes an upper surface 622 with a central bond region 624, interconnect regions 626 surrounding bond sites 632 for interconnects within the die 610, and peripheral bond regions 628. The chemical composition of the material 620 can vary depending on the region of the upper surface 622. For example, in some embodiments, the central bond region 624 and the peripheral bond regions 628 can have a reactive chemical composition (e.g., any of the reactive compositions discussed above with respect to FIGS. 2A-5B), while the interconnect regions 626 can have a generally non-reactive chemical composition (e.g., an inert dielectric, a cured polymer, or other suitable material).

As a result, when the die 610 is stacked on another die with corresponding regions, the hybrid bonding process can react the material in the central bond region 624 and the peripheral bond regions 628 with the corresponding regions on the stacked die to form a bond while the interconnect regions 626 will remain non-reactive. In various embodiments, the upper surface 622 can include various other divisions into reactive and non-reactive regions. The divisions can be pre-determined based on desired locations for reactions (e.g., spaced apart from damageable components such as corruptible bond sites), desired locations for increased bond strength, and/or convenience for depositing the reactive chemical composition during manufacturing.

Figure 7:
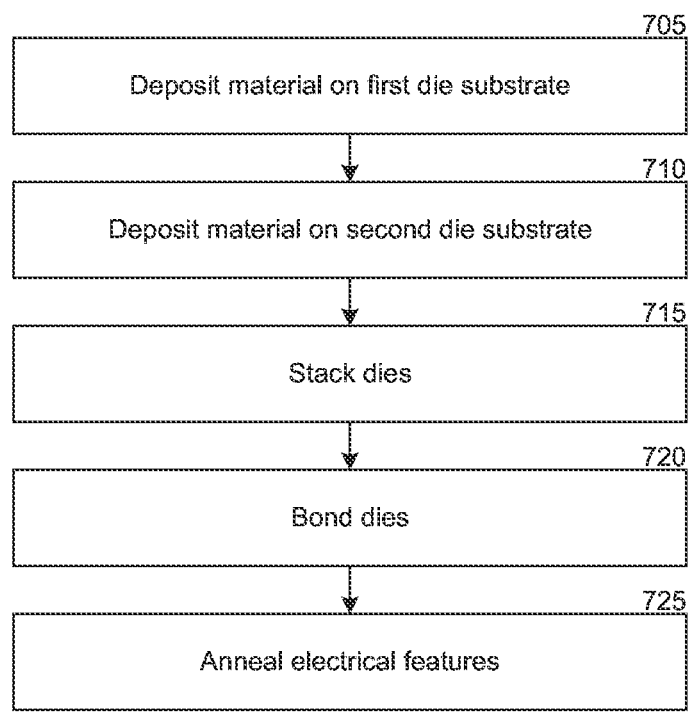
FIG. 7 is a flow diagram of a hybrid bonding process between using reactive materials in accordance with some embodiments of the present technology.

FIG. 7 is a flow diagram of a hybrid bonding process between using reactive materials in accordance with some embodiments of the present technology. At block 705, the process 700 includes depositing a first material on a first die substrate. As discussed in detail above, the first material can have a first chemical composition at an outer surface. In some embodiments, the first material has the first chemical composition throughout the first material. In some embodiments, the first material has the first chemical composition at a sublayer near the outer surface. In some embodiments, the first material has a chemical composition gradient from an inner surface adjacent the first die substrate to the outer surface. As further discussed above the first material can be a dielectric, a polymer backed colloid, a polymer with a crosslinker concentration, or any other suitable material. Purely by way of example, if the first material is a dielectric, block 705 can include a CVD process with varied ratios of gasses used in the CVD process.

At block 710, the process 700 includes depositing a second material on a second die substrate. As discussed in detail above, the second material can have a second chemical composition at an outer surface of the second material that is different from the first chemical composition. In some embodiments, the second material has the second chemical composition throughout the second material. In some embodiments, the second material has the second chemical composition at a sublayer near the outer surface. In some embodiments, the second material has the chemical composition gradient from an inner surface adjacent the second die substrate to the outer surface of the second material. In some embodiments, the second chemical composition is reactively opposite the first chemical composition. For example, if the first material is a polymer-backed colloid with a first species A suspended therein, the second material can be a polymer-backed colloid with a second species B suspended therein that is reactive with the first species A.

At block 715, the process 700 includes stacking the first and second dies to place the outer surface of the first material in contact with the outer surface of the second material. In some embodiments, the first die includes at least one first electrical feature (e.g., an interconnect structure) while the second die includes at least one second electrical feature (e.g., an interconnect structure). The first electrical feature can have an exposed portion at the outer surface of the first material, while the electrical feature structure can have an exposed portion at the outer surface of the second material. In such embodiments, block 715 can include aligning the exposed portion of the first electrical feature with the exposed portion of the second electrical feature.

At block 720, the process 700 includes fusion and metal-metal bonding the stacked dies. As discussed above, each of the dies includes a material with an outer surface having a chemical composition. The first and second chemical compositions are reactive to each other. Accordingly, the process 700 includes causing a reaction between the first and second chemical compositions to meld the first material and the second material in order to bond the stacked dies. In some embodiments, the reaction is exergonic, such that the outer surfaces of the stacked dies begin to react on contact. In some such embodiments, the reaction is exothermic and releases a small amount of heat that further encourages the bonding between the outer surfaces of the stacked dies. In some embodiments, the reaction is endergonic and requires some activation energy to initiate. In various such embodiments, block 720 includes heating the stacked dies, providing an electrical activation energy to the stacked dies, applying a small amount of pressure to the stacked dies, and/or providing any other suitable form of activation energy. In some embodiments, block 720 can include supplying excess energy (e.g., thermal, electrical, and/or pressure) to act as a catalyst to the reaction. As discussed above, a result of the reaction is a strong bond between the two materials as molecules migrate between the two materials to react.

In some embodiments, the alignment at block 715 causes the exposed portions of the electrical features to be in contact with each other, thereby establishing an electrical connection between the electrical features. Because the strong bond between the first material and the second material will hold the two substrates in place with respect to each other, in some embodiments, the process 700 is complete after bonding the surfaces together. In the illustrated embodiment, the process 700 includes annealing the electrical features to further establish an electrical connection therebetween at optional block 725. Annealing the electrical features can include heating the stacked dies to cause a small amount of reflow between the two electrical features. The annealed electrical features can maintain a robust electrical connection through the life of the resulting stacked dies. In some embodiments, the annealed electrical features can also further improve the strength of the bond between the stacked dies.

Figure 8:
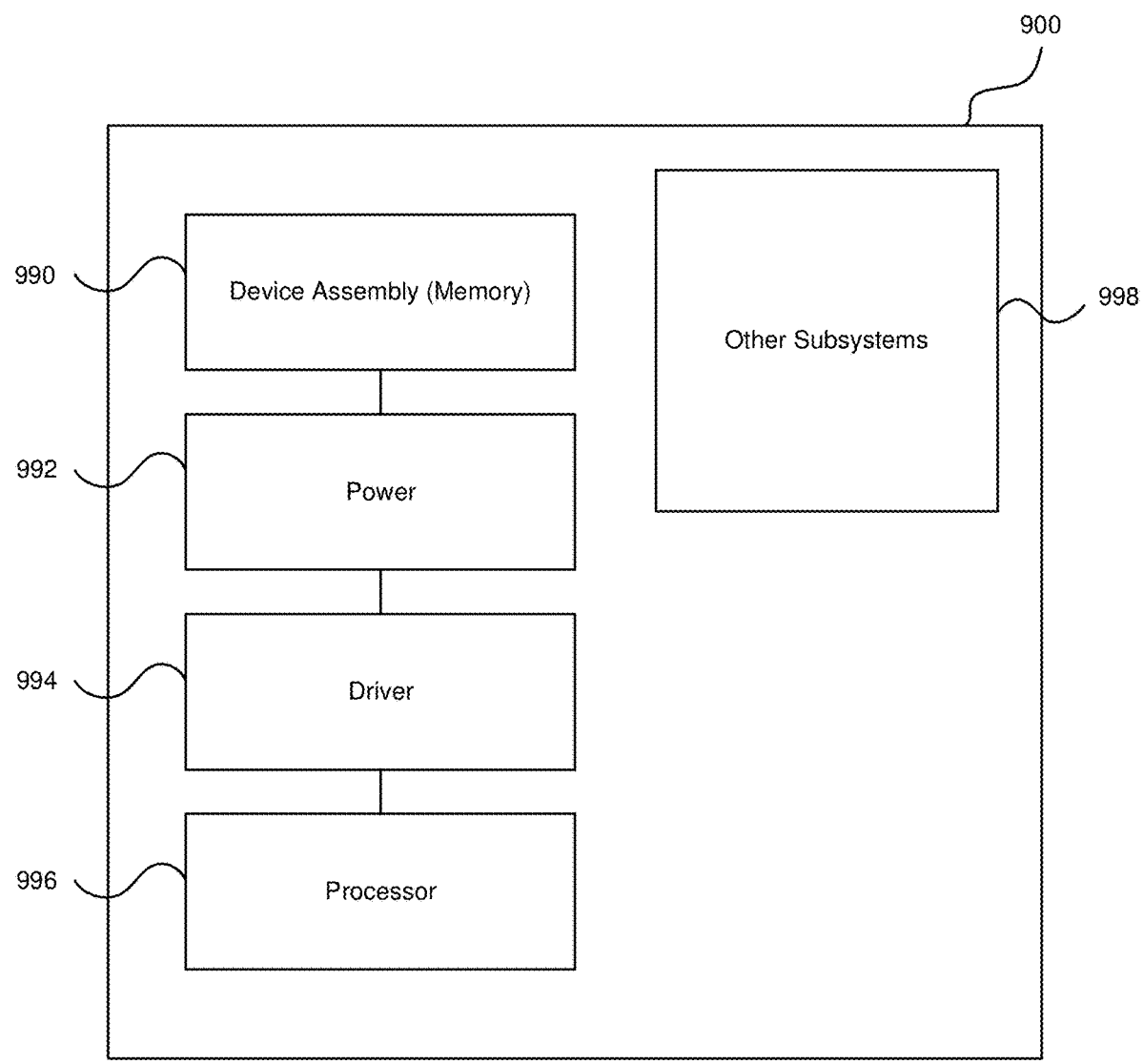
FIG. 8 is a schematic view of a system that includes a semiconductor die assembly configured in accordance with some embodiments of the present technology.

FIG. 8 is a schematic view of a system that includes a semiconductor die assembly configured in accordance with embodiments of the present technology. Any one of the semiconductor devices having the features described above with reference to FIGS. 1A-7 can be incorporated into any of a myriad of larger and/or more complex systems, a representative example of which is system 900 shown schematically in FIG. 8. The system 900 can include a memory 990 substantially as described above (e.g., SRAM, DRAM, flash, and/or other memory devices), a power supply 992, a drive 994, a processor 996, and/or other subsystems or components 998. The semiconductor devices described above with reference to FIGS. 1A-7 can be included in any of the elements shown in FIG. 8. For example, the memory 990 can be include a stack of semiconductor dies bonded in accordance with the process described above with respect to FIG. 7. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 900 include lights, cameras, vehicles, etc. With regard to these and other example, the system 900 can be housed in a single unit or distributed over multiple interconnected units, e.g., through a communication network. The components of the system 900 can accordingly include local and/or remote memory storage devices and any of a wide variety of suitable computer-readable media.

Examples

The present technology is illustrated, for example, according to various aspects described below. Various examples of aspects of the present technology are described as numbered examples (1, 2, 3, etc.) for convenience. These are provided as examples and do not limit the present technology. It is noted that any of the dependent examples can be combined in any suitable manner, and placed into a respective independent example. The other examples can be presented in a similar manner.

1. A method for bonding semiconductor dies, the method comprising:
depositing a first dielectric on a first semiconductor die, wherein the first dielectric includes a first material and a second material in a first molecular ratio at a first surface of the first dielectric;
depositing a second dielectric on a second semiconductor die, wherein the second dielectric includes the first material and the second material in a second molecular ratio different from the first molecular ratio at a second surface of the second dielectric;
stacking the second semiconductor die and the first semiconductor die with the first surface in contact with the second surface; and
bonding the first surface with the second surface by diffusing the second material from the second dielectric to the first dielectric.

2. The method of example 1 wherein bonding the first surface with the second surface comprises an exothermic reaction, and wherein the first molecular ratio and the second molecular ratio are stoichiometrically oppositely imbalanced ratios.

3. The method of any of examples 1 and 2 wherein the first dielectric includes a third surface opposite the first surface contacting the first die, wherein the first dielectric includes the first material and the second material in a third molecular ratio different from the first molecular ratio at the third surface, and wherein the first dielectric includes a central portion having a molecular ratio a gradient from the third molecular ratio adjacent the third surface to the first molecular ratio adjacent surface first.

4. The method of any of examples 1-3 wherein:
the first semiconductor die includes a first interconnect, wherein a portion of the first interconnect is at least partially exposed at the first surface;
the second semiconductor die includes a second interconnect, wherein a portion of the second interconnect is exposed at the second surface; and
wherein the method further comprises:
aligning the exposed portion of the first interconnect with the exposed portion of the second interconnect; and
annealing the exposed portion of the first interconnect and the exposed portion of the second interconnect to form an electrical connection between the first interconnect and the second interconnect.

5. The method of any of examples 1-4 wherein bonding the first surface with the second surface includes heating the stacked first and second semiconductor dies to initiate the diffusing.

6. The method of any of examples 1-5 wherein reacting the surface of the first dielectric in with the second surface of the second dielectric includes providing an electrical catalyst to the stacked first and second semiconductor dies to initiate the diffusing.

7. The method of any of examples 1-6 wherein depositing the first dielectric on the first semiconductor die includes a chemical vapor deposition process, and wherein a ratio of chemical vapors is varied during the chemical vapor deposition process to deposit the first material and the second material in the first molecular ratio at the first surface.

8. The method of example 7 wherein the chemical vapor deposition process is a first chemical vapor deposition process, wherein the ratio of chemical vapors is a first ratio of chemical vapors, wherein depositing the second dielectric on the second semiconductor die includes a second chemical vapor deposition process, and wherein a second ratio of chemical vapors is varied during the second chemical vapor deposition process inverse to the first chemical vapor deposition process to deposit the first material and the second material in the second molecular ratio at the second surface.

9. The method of any of examples 1-8 wherein depositing the first dielectric on the first semiconductor die includes a spin-coating process to deposit a spin-on-dielectric, and wherein a ratio of deposition materials is varied during the spin-coating process to deposit the first material and the second material in the first molecular ratio at the first surface.

10. The method any of examples 1-9, wherein:
the first material is silicon and the second material is oxygen;
the first molecular ratio contains less oxygen than a stoichiometrically balanced silicon dioxide;
the second molecular ratio contains more oxygen than the stoichiometrically balanced silicon dioxide; and
the bonding causes oxygen to migrate from the second dielectric to the first dielectric.

11. A method for bonding a first semiconductor die to a second semiconductor die, the method comprising:
depositing a first material on the first semiconductor die, wherein the first material has a first outer surface, and wherein the first material has a first chemical composition at the first outer surface;
depositing a second material on the second semiconductor die, wherein the second material has a second outer surface, and wherein the second substrate has a second chemical composition at the second outer surface that is different from the first chemical composition;

stacking the second outer surface of the second semiconductor die in contact with the first outer surface of the first semiconductor die; and reacting the first outer surface with the second outer surface, the reaction causing the first outer surface to bond to the second outer surface.

12. The method of example 11 wherein:

the first semiconductor die includes a first interconnect having an exposed portion at the first outer surface and an embedded portion within the first semiconductor die;

the second semiconductor die includes a second interconnect having an exposed portion at the second outer surface and a through-substrate portion within the second semiconductor die; and wherein the method further comprises:

aligning the exposed portion of the first interconnect with the exposed portion of the second interconnect before the reaction; and annealing the exposed portion of the first interconnect and the exposed portion of the second interconnect to form an electrical connection between the first interconnect and the second interconnect.

13. The method of any of examples 11 and 12, wherein:

the first material and the second material comprise a silicon-based dielectric material;

the first chemical composition contains a higher ratio of silicon than a stoichiometrically balanced ratio of silicon for the dielectric material; and the second chemical composition contains a lower ratio of silicon than the stoichiometrically balanced ratio of silicon for the dielectric material.

14. The method of any of examples 11 and 12, wherein:

the first material includes a first polymer-backed colloid having a first molecular species suspended therein; and the second material includes a second polymer-backed colloid having a second molecular species suspended therein, wherein the first molecular species and the second molecular species are exothermically reactive, and wherein the reaction produces a third polymer-backed colloid having a third molecular species suspended therein.

15. The method of any of examples 11 and 12, wherein:

the first material includes a partially cured polymer with a first crosslinker concentration lower than a preferred crosslinker concentration of the polymer; and the second material includes the partially cured polymer with a second crosslinker concentration higher than the preferred crosslinker concentration of the polymer.

16. The method of any of examples 11-15, wherein the first outer surface of the first material and the second outer surface of the second material have a third chemical composition after the reaction, wherein the third chemical composition is not reactive with the first and second chemical compositions.

17. A stacked semiconductor device, comprising:

a first semiconductor die;

a second semiconductor die disposed over the first semiconductor die;

a bonding layer positioned between the first semiconductor die and the second semiconductor die, the bonding layer including:

a first portion between the first semiconductor die and the second semiconductor die having a first molecular composition; and a second portion between the first portion and the first semiconductor die having a second molecular composition different from the first molecular composition.

18. The stacked semiconductor device of example 17 wherein the bonding layer is a silicon dioxide dielectric, wherein the first molecular composition contains a molecularly balanced ratio of silicon to oxygen, and wherein the second molecular composition contains less oxygen than the molecularly balanced ratio of silicon to oxygen.

19. The stacked semiconductor device of any of examples 17 and 18, wherein:

the bonding layer is a polymer-backed colloid layer;

the second portion of the bonding layer has a first molecular species suspended therein;

the bonding layer further includes a third portion between the first portion and the second semiconductor die having second molecular species suspended therein; and the first portion of the bonding layer has a third molecular species suspended therein, the third molecular species a product of a reaction between the first molecular species and the second molecular species.

20. The stacked semiconductor device of any of examples 17-19:

the bonding layer is a polymer substrate with a crosslinker;

the first portion of the bonding layer has a first concentration of the crosslinker;

the second portion of the bonding layer has a second concentration of the crosslinker different from the first concentration.

CONCLUSION

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A method for bonding semiconductor dies, the method comprising:
   depositing a first dielectric on a first semiconductor die, wherein the first dielectric includes a first material and a second material in a first molecular ratio at a first surface of the first dielectric;
   depositing a second dielectric on a second semiconductor die, wherein the second dielectric includes the first material and the second material in a second molecular ratio different from the first molecular ratio at a second surface of the second dielectric;
   stacking the second semiconductor die and the first semiconductor die with the first surface in contact with the second surface; and
   bonding the first surface with the second surface by diffusing the second material from the second dielectric to the first dielectric.

2. The method of claim 1 wherein bonding the first surface with the second surface comprises an exothermic reaction, and wherein the first molecular ratio and the second molecular ratio are stoichiometrically oppositely imbalanced ratios.

3. The method of claim 1 wherein the first dielectric includes a third surface opposite the first surface contacting the first die, wherein the first dielectric includes the first material and the second material in a third molecular ratio at the third surface different from the first molecular ratio, and wherein the first dielectric includes a central portion having a molecular ratio gradient from the third molecular ratio adjacent the third surface to the first molecular ratio adjacent the first surface.

4. The method of claim 1 wherein:
   the first semiconductor die includes a first interconnect, wherein a portion of the first interconnect is at least partially exposed at the first surface;
   the second semiconductor die includes a second interconnect, wherein a portion of the second interconnect is exposed at the second surface; and
   the method further comprises:
      aligning the exposed portion of the first interconnect with the exposed portion of the second interconnect; and
      annealing the exposed portion of the first interconnect and the exposed portion of the second interconnect to form an electrical connection between the first interconnect and the second interconnect.

5. The method of claim 1 wherein bonding the first surface with the second surface includes heating the stacked first and second semiconductor dies to initiate the diffusing.

6. The method of claim 1 wherein reacting the surface of the first dielectric in with the second surface of the second dielectric includes providing an electrical catalyst to the stacked first and second semiconductor dies to initiate the diffusing.

7. The method of claim 1 wherein depositing the first dielectric on the first semiconductor die includes a chemical vapor deposition process, and wherein a ratio of chemical vapors is varied during the chemical vapor deposition process to deposit the first material and the second material in the first molecular ratio at the first surface.

8. The method of claim 7 wherein the chemical vapor deposition process is a first chemical vapor deposition process, wherein the ratio of chemical vapors is a first ratio of chemical vapors, wherein depositing the second dielectric on the second semiconductor die includes a second chemical vapor deposition process, and wherein a second ratio of chemical vapors is varied during the second chemical vapor deposition process inverse to the first chemical vapor deposition process to deposit the first material and the second material in the second molecular ratio at the second surface.

9. The method of claim 1 wherein depositing the first dielectric on the first semiconductor die includes a spin-coating process to deposit a spin-on-dielectric, and wherein a ratio of deposition materials is varied during the spin-coating process to deposit the first material and the second material in the first molecular ratio at the first surface.

10. The method of claim 1, wherein:
    the first material is silicon and the second material is oxygen;
    the first molecular ratio contains less oxygen than a stoichiometrically balanced silicon dioxide;
    the second molecular ratio contains more oxygen than the stoichiometrically balanced silicon dioxide; and
    the bonding causes oxygen to migrate from the second dielectric to the first dielectric.

11. A method for bonding a first semiconductor die to a second semiconductor die, the method comprising:
    depositing a first material on the first semiconductor die, wherein the first material has a first outer surface, and wherein the first material has a first chemical composition at the first outer surface;
    depositing a second material on the second semiconductor die, wherein the second material has a second outer surface, and wherein the second material has a second chemical composition at the second outer surface that is different from the first chemical composition;
    stacking the second outer surface of the second semiconductor die in contact with the first outer surface of the first semiconductor die; and
    reacting the first outer surface with the second outer surface, the reaction causing the first outer surface to bond to the second outer surface.

12. The method of claim 11 wherein:
    the first semiconductor die includes a first interconnect having an exposed portion at the first outer surface and an embedded portion within the first semiconductor die;
    the second semiconductor die includes a second interconnect having an exposed portion at the second outer surface and a through-substrate portion within the second semiconductor die; and
    the method further comprises:
       aligning the exposed portion of the first interconnect with the exposed portion of the second interconnect before the reaction; and
       annealing the exposed portion of the first interconnect and the exposed portion of the second interconnect to form an electrical connection between the first interconnect and the second interconnect.

13. The method of claim 11, wherein:
    the first material and the second material comprise a silicon-based dielectric material;
    the first chemical composition contains a higher ratio of silicon than a stoichiometrically balanced ratio of silicon for the dielectric material; and the second chemical composition contains a lower ratio of silicon than the stoichiometrically balanced ratio of silicon for the dielectric material.

14. The method of claim 11, wherein:
the first material includes a first polymer-backed colloid having a first molecular species suspended therein; and
the second material includes a second polymer-backed colloid having a second molecular species suspended therein,
wherein the first molecular species and the second molecular species are exothermically reactive, and wherein the reaction produces a third polymer-backed colloid having a third molecular species suspended therein.

15. The method of claim 11, wherein:
the first material includes a partially cured polymer with a first crosslinker concentration lower than a preferred crosslinker concentration of the polymer; and
the second material includes the partially cured polymer with a second crosslinker concentration higher than the preferred crosslinker concentration of the polymer.

16. The method of claim 11, wherein the first outer surface of the first material and the second outer surface of the second material have a third chemical composition after the reaction, wherein the third chemical composition is not reactive with the first and second chemical compositions.

* * * * *